(12) United States Patent
Göötz

(10) Patent No.: US 11,171,129 B2
(45) Date of Patent: Nov. 9, 2021

(54) METHOD FOR PRODUCING AN OPTOELECTRONIC COMPONENT AND OPTOELECTRONIC COMPONENT

(71) Applicant: OSRAM Opto Semiconductors GmbH, Regensburg (DE)

(72) Inventor: Britta Göötz, Regensburg (DE)

(73) Assignee: OSRAM OLED GMBH, Regensburg (DE)

(*) Notice: Subject to any disclaimer, the term of this patent is extended or adjusted under 35 U.S.C. 154(b) by 0 days.

(21) Appl. No.: 16/498,996

(22) PCT Filed: Apr. 10, 2018

(86) PCT No.: PCT/EP2018/059169
§ 371 (c)(1),
(2) Date: Sep. 27, 2019

(87) PCT Pub. No.: WO2018/189183
PCT Pub. Date: Oct. 18, 2018

(65) Prior Publication Data
US 2020/0051963 A1    Feb. 13, 2020

(30) Foreign Application Priority Data
Apr. 12, 2017 (DE) .................... 102017107939.4

(51) Int. Cl.
*C08F 4/44* (2006.01)
*H01L 25/16* (2006.01)
(Continued)

(52) U.S. Cl.
CPC ........ *H01L 25/167* (2013.01); *H01L 25/0753* (2013.01); *H01L 33/504* (2013.01); *C25D 13/12* (2013.01)

(58) Field of Classification Search
CPC . H01L 27/156; H01L 25/0753; H01L 33/005; H01L 33/504; C25D 13/02; C25D 13/12
See application file for complete search history.

(56) References Cited

U.S. PATENT DOCUMENTS 9,825,208 B2   11/2017   Otto et al.
9,947,838 B2    4/2018   Pfeuffer et al.
(Continued)

FOREIGN PATENT DOCUMENTS

DE    102012106859 A1    1/2014
DE    102013209369 A1   11/2014
(Continued)

OTHER PUBLICATIONS

Machine translation of KR20070042730A (Year: 2007).*

*Primary Examiner* — Brian Turner
(74) *Attorney, Agent, or Firm* — Slater Matsil, LLP

(57) ABSTRACT

A method for producing an optoelectronic component and an optoelectronic component are disclosed. In an embodiment a method includes providing a semiconductor layer sequence comprising a plurality of pixels and an active layer, wherein the active layer is configured to emit a primary radiation in a blue region of an electromagnetic spectrum with a peak wavelength of between 420 nm inclusive and 480 nm inclusive, applying a first photoresist and a first converter material on the semiconductor layer sequence, exposing the first photoresist with radiation having the peak wavelength longer than the peak wavelength of the primary radiation, curing the first photoresist by polymerization in order to form a first converter layer comprising a matrix material and the first converter material and structuring the first converter layer.

18 Claims, 3 Drawing Sheets

(51) Int. Cl.
*H01L 25/075* (2006.01)
*H01L 21/66* (2006.01)
*G09G 3/32* (2016.01)
*H01L 33/50* (2010.01)
*C25D 13/12* (2006.01)

(56) References Cited

U.S. PATENT DOCUMENTS

| | | | |
|---|---|---|---|
| 9,985,011 B2 | 5/2018 | Göötz et al. | |
| 2007/0099096 A1* | 5/2007 | Sasaki | G03F 7/027 430/7 |
| 2008/0106186 A1* | 5/2008 | Ishii | H01L 33/504 313/503 |
| 2010/0177488 A1* | 7/2010 | Rhodes | C08F 232/00 361/748 |
| 2011/0284494 A1* | 11/2011 | Von Malm | H01L 51/5036 216/13 |
| 2014/0054634 A1* | 2/2014 | Fukuda | H01L 33/504 257/98 |
| 2015/0338705 A1* | 11/2015 | Itou | F21V 9/00 349/43 |
| 2018/0062049 A1* | 3/2018 | Otsuka | H01L 33/56 |
| 2018/0358339 A1* | 12/2018 | Iguchi | H01L 25/0753 |

FOREIGN PATENT DOCUMENTS

| | | |
|---|---|---|
| DE | 102013109031 A1 | 2/2015 |
| DE | 102014112769 A1 | 3/2016 |
| KR | 20070042730 A * | 4/2007 |

\* cited by examiner

METHOD FOR PRODUCING AN OPTOELECTRONIC COMPONENT AND OPTOELECTRONIC COMPONENT

This patent application is a national phase filing under section 371 of PCT/EP2018/059169, filed Apr. 10, 2018, which claims the priority of German patent application 102017107939.4, filed Apr. 12, 2017, each of which is incorporated herein by reference in its entirety.

TECHNICAL FIELD

A method for producing an optoelectronic component is specified. In addition, an optoelectronic component is specified.

BACKGROUND

Converter layers for full conversion of primary radiation of single small pixels of a pixelated semiconductor chip are subject to many requirements. For example, the conversion take place close to the chip and the layer thicknesses of the converter layers are small. Known inorganic phosphors are not suitable because their grain sizes are larger than those of small pixels, for example, with an edge length of 5 μm. In addition, no efficient method is known for arranging thin converter layers above the individual small pixels. It is known to apply thin layers by means of a photoresist which is cured by UV radiation. However, these photoresists are not suitable for the production of converter layers for small pixels, since the converter materials used usually have a higher absorption in the UV region than in the blue region of the electromagnetic spectrum, so that the layer thickness required for the full conversion of primary radiation in the blue region is greater than the penetration depth of the UV radiation, so that these photoresists cannot be completely cured. In addition, UV-cured materials often show the problem that they are unstable to light in the long run and therefore cannot be used in an optoelectronic component. Since blue primary radiation also has a low proportion of radiation in the UV region, it is absorbed by the cured photoresist and is therefore not or not completely available for conversion by the converter materials, which leads to undesirable efficiency losses.

SUMMARY OF THE INVENTION

Embodiments provide a method for producing an optoelectronic component with a plurality of pixels and converter layers. Further embodiments provide an optoelectronic component with a plurality of pixels and converter layers.

Various embodiments provide a method for producing an optoelectronic component. The method comprises the following steps, preferably in the order given:

A) providing a semiconductor layer sequence having a plurality of pixels. The semiconductor layer sequence comprises an active layer which is configured to emit primary radiation in the blue region of the electromagnetic spectrum with a peak wavelength between 420 nm inclusive and 480 nm inclusive.

B) applying a photoresist and a first converter material on the semiconductor layer sequence.

D) exposing the photoresist with a radiation having a peak wavelength longer than the peak wavelength of the primary radiation.

E) curing the photoresist by a polymerization in order to form a first converter layer comprising a matrix material and the first converter material. In particular, the matrix material is created by the polymerization of the photoresist.

F) Structuring the first converter layer. Preferably, the first converter layer is structured in such a way that it is arranged over a part of the plurality of pixels, while another part of the pixels is free of the first converter layer.

The "peak wavelength" is the wavelength in the emission spectrum at which the maximum intensity lies in the emission spectrum.

The polymerization of the photoresist is initiated by the exposure of the photoresist; the photoresist hardens and forms the matrix material. In particular, the first converter material is distributed in the matrix material, preferably homogeneously distributed. Advantageously, the exposure and thus the initiation of the polymerization occur with a radiation that is longer wavelength than the primary radiation. This ensures that the first converter material, which preferably has a maximum absorption in the region of the peak wavelength of the primary radiation, does not absorb this radiation or hardly absorbs it at all and that this radiation is therefore used completely or almost completely for exposing the photoresist.

According to at least one embodiment, the matrix material is transparent to the primary and secondary radiation of the converter material. By transparent it is understood that the matrix material is at least partially transparent to primary radiation as well as to secondary radiation.

According to at least one embodiment, the photoresist in step D) is exposed to radiation with a peak wavelength between 480 nm and 10000 nm inclusive, preferably between 480 nm and 3000 nm, further preferably 550 nm to 1500 nm. This means that the radiation with which the photoresist is exposed lies in the visible or infrared region of the electromagnetic spectrum. Exposure to radiation in the infrared region can also be described as thermal curing of the photoresist and exposure to radiation in the visible region can also be described as photo-induced curing of the photoresist. If the radiation lies in the infrared region of the electromagnetic spectrum, an IR laser can preferably be used for exposure. The layer thicknesses of the converter layer are preferably selected between 800 nm and 1500 nm, so that a complete curing of the photoresist is also possible by using an IR laser or radiation in the infrared region. For example, a $CO_2$ laser can be used for exposure.

According to at least one embodiment, the photoresist in step D) is exposed to a radiation with a peak wavelength between 1000 nm and 10000 nm, preferably between 1000 nm and 3000 nm.

According to at least one embodiment, the plurality of pixels is arranged laterally next to each other. The plurality of pixels is presently surrounded by a common semiconductor layer sequence. The structuring of the pixels can be done in particular by removing material from part of the semiconductor layer sequence. In other words, the semiconductor layer sequence can be structured, for example, by etching. Preferably, removal of material from the semiconductor layer sequence takes place between adjacent pixels.

According to at least one embodiment, the pixels have a common active layer that extends laterally through all pixels along a major surface of the semiconductor layer sequence. However, the active layer generates electromagnetic primary radiation only in the areas of the pixels by means of a suitable current supply, so that directly adjacent pixels are separated from each other by optically inactive areas which do not generate radiation.

According to at least one embodiment, the semiconductor layer sequence is based on a III-V compound semiconductor material. For example, the semiconductor material is a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or such as $Al_nGa_mIn_{1-n-m}As_kP_{1-k}$, wherein in each case $0 \leq n \leq 1$, $0 \leq m \leq 1$ and $n+m \leq 1$ and $0 \leq k < 1$. For at least one layer or for all layers of the semiconductor layer sequence, $0 < n \leq 0.8$, $0.4 \leq m < 1$ and $n+m \leq 0.95$ and $0 < k \leq 0.5$ preferably apply here. The semiconductor layer sequence can contain dopants and additional components. For the sake of simplicity, however, only the essential components of the crystal lattice of the semiconductor layer sequence, as Al, As, Ga, In, N or P, are given, even if these can be partially replaced and/or supplemented by small quantities of other substances.

According to at least one embodiment, the pixels comprise an edge length between 4500 nm inclusive and 5500 nm inclusive, preferably between 4800 nm inclusive and 5200 nm inclusive, particularly preferably between 4900 nm inclusive and 5100 nm inclusive, for example, 5000 nm. The pixels preferably have a quadratic geometry.

According to at least one embodiment, the semiconductor layer sequence is arranged on a carrier. The carrier is preferably based on a semiconductor material such as silicon or germanium. The carrier preferably has a plurality of control units. Particularly preferably, each pixel is assigned a control unit and vice versa, whereby the pixels are electrically contacted independently of each other and can be controlled independently of each other. In particular, the carrier is a semiconductor carrier based on silicon, which has control units. The control units can be generated in CMOS technology.

According to at least one embodiment, each pixel has a radiation exit surface from which the primary radiation is emitted. The first converter layer is formed in particular on the radiation exit surface of individual pixels. Preferably, the first converter layer covers the radiation exit surface of individual pixels completely or over the entire surface. Preferably, the first converter layer is not over all pixels of the semiconductor layer sequence, but only over a part of the plurality of pixels. Preferably, the first converter layer is in direct contact with the radiation exit surface of the pixel.

According to at least one embodiment, the polymerization in step E) is a cationic polymerization, a radical polymerization, an anionic polymerization or a hydrosilylation.

According to at least one embodiment, a photoresist is a composition that cures by exposure. Exposure is not only an exposure in the UV region or in the visible region of the electromagnetic spectrum, but also in the IR region, for example. The term photoresist is therefore not limited to conventional photoresists. For example, the exposure takes place at 480 nm to 10000 nm.

According to at least one embodiment, the photoresist comprises at least a monomer and a catalyst or consists of a monomer and a catalyst. The catalyst preferably initiates the polymerization when it is exposed to radiation with a peak wavelength that is longer than the peak wavelength of the primary radiation, preferably with a peak wavelength between 480 nm and 10000 nm, more preferably with a peak wavelength between 480 nm and 3000 nm.

If the catalyst is activated by exposure to radiation in the visible region, it can also absorb the secondary radiation in the converter layer. However, this only leads to minor losses in efficiency, since the catalyst, as the person skilled in the art knows, is only present in small proportions.

According to at least one embodiment, the catalyst is decomposed after method step E), so the curing of the photoresist, in order to guarantee a high transparency of the converter layer. This can be advantageous, for example, if the catalyst absorbs radiation in the visible region so that this radiation can no longer be radiated outwards from the component. This can be done, for example, by a further exposure step or a tempering step after step E). In particular, radiation deviating from the radiation used to expose the photoresist can be used.

According to at least one embodiment, the photoresist comprises a catalyst, a monomer having at least two SiH groups and a monomer having at least two terminal double bonds, and the polymerization in step E) is a hydrosilylation. The photoresist can also consist of a catalyst, a monomer having at least two SiH groups and a monomer having at least two terminal double bonds. The monomers are preferably used in a molar ratio of 1:1.

For example, the monomer having at least two terminal double bonds can be a compound of formula 1 and the monomer having at least two SiH groups can be a compound of formula 2:

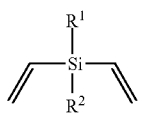

Formula 1

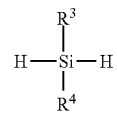

Formula 2

$R^1$ and $R^2$ are independently selected from a group consisting of vinyl, alkoxy, alkyl and aryl residues.

$R^3$ and $R^4$ are independently selected from a group consisting of H, alkoxy, alkyl and aryl residues.

A hydrosilylation is the addition of a silane to a double bond, in particular the syn-selective anti-Markovnikov addition of a silane to a double bond.

According to at least one embodiment, the catalyst of the hydrosilylation is a platinum catalyst. The platinum catalyst can preferably be activated by irradiation with a radiation which is longer wavelength than the peak wavelength of the primary radiation, preferably with a peak wavelength between 480 nm and 10000 nm, further preferably with a peak wavelength between 480 nm and 3000 nm. The platinum catalyst can be converted from a non-reactive form into a reactive form so that a reaction takes place between the monomers, in particular a cross-linking.

The platinum catalyst in its reactive form, so after exposure in step D), can be a platinum-carbonylcyclovinylmethylsiloxane complex, a platinum-1,3-divinyl-1,1,3,3-tetrymethyldisiloxane complex, a platinum-tetravinyltetramethyltetracyclosiloxane complex or a platinum-octanaloctanol complex.

The hydrosilylation reaction can take place, for example, after the following reaction:

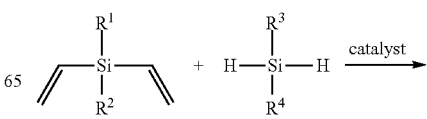

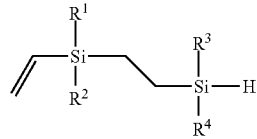

The hydrosilylation product shown here can enter into further hydrosilylations via the SiH group or the vinyl group.

According to at least one embodiment, the photoresist comprises at least a monomer and an inhibitor or consists of a monomer and an inhibitor. In addition, the photoresist in this version can contain a catalyst. The inhibitor is used to prevent the polymerization of the at least one monomer, so without the addition of the inhibitor the monomer would cure with or without a catalyst. In particular, the inhibitor is destroyed by the radiation in step D) so that the polymerization takes place. This method has the advantage that the inhibitor is already destroyed by the radiation in step D) and this does not have to take place in a separate step. Thus, it is advantageous that there are no or hardly any absorption losses of the radiation of the optoelectronic component by the inhibitor.

According to at least one embodiment, the photoresist comprises materials as used in sol-gel processes (hereinafter referred to as sol-gel materials). For example, these are Si-based sol-gel materials. The inventors have recognized that a number of sol-gel materials cure under exposure (e.g., by microwave radiation and/or infrared radiation).

For example, the photoresist comprises at least one material having the general formula $Si(OR)_4$, wherein R is a linear or branched alkyl, preferably a linear or branched $C_1$-$C_5$-alkyl.

For example, the photoresist comprises at least one material selected from the group of the following materials:
Tetramethylorthosilicate (TMOS),
Tetraethylorthosilicate (TEOS),
Tetraisopropylorthosilicate (TPOS)
or combinations thereof.

According to at least one embodiment, the following step takes place between step B) and D):

C) Applying a mask over the photoresist, wherein the mask has recesses. In step D) the photoresist is exposed in the areas of the mask recesses and the first converter layer is structured in step F) by removing the photoresist from the unexposed areas and thus removing the uncured photoresist. Particularly preferred are the recesses of the mask formed according to the pixels or the radiation exit surfaces of the pixels and arranged above the pixels. The mask preferably covers a proportion of the pixels completely, while the recesses of the mask are arranged above another proportion of the pixels. Individual pixels or the radiation exit surface of individual pixels are preferred if they are completely or over the entire surface not covered by the mask.

According to at least one embodiment, the structuring of the first converter layer in step F) is performed by a laser. Preferably, the first converter layer is structured in such a way that it is arranged over a part of the plurality of pixels, while another part of the pixels is free of the first converter layer. Preferably, the first converter layer covers the radiation exit surface of individual pixels completely or over the entire surface.

According to at least one embodiment, the method comprises the further steps:

G) applying a photoresist and a second converter material to the semiconductor layer sequence.

I) exposing the photoresist with a radiation having a peak wavelength longer than the peak wavelength of the primary radiation.

J) curing the photoresist by polymerization to form a second converter layer comprising a matrix material and the second converter material.

K) Structuring the second converter layer. In particular, the steps G) to K) take place after step F) and particularly preferably in the order given.

The photoresist of step G) can be the same photoresist as in step B). All features of the steps B) to F) are also disclosed for the steps G) to K). The second converter layer can therefore be produced in particular like the first converter layer. Differences exist in particular only with regard to the converter material.

According to at least one embodiment, the first converter material and/or the first and second converter materials are configured to convert or convert the primary radiation into a secondary radiation in the longer wavelength region of the electromagnetic spectrum than the primary radiation. The secondary radiation of the first and/or the second converter material preferably lies in the green or red region of the electromagnetic spectrum. The conversion of the primary radiation is particularly preferred completely. Full conversion means in particular that over 95% or over 97% of primary radiation is converted into secondary radiation. In other words, the proportion of primary radiation emitted by the first and/or second converter layer is less than 5%, preferably less than 3%.

Preferably, the second converter material is a different converter material to the first converter material. For example, the first converter material converts the primary radiation into a secondary radiation in the green region of the electromagnetic spectrum and the second converter material converts the primary radiation into a secondary radiation in the red region of the electromagnetic spectrum or vice versa.

According to at least one embodiment, the following step takes place between step G) and I):

H) Applying a mask over the photoresist, wherein the mask comprises recesses. The exposure of the photoresist in step I) in the areas of the recesses of the mask and the structuring of the second converter layer in step K) is carried out by removing the photoresist at the unexposed areas and thus removing the uncured photoresist. Particularly preferred are the recesses of the mask formed according to the pixels or the radiation exit surfaces of the pixels and arranged above the pixels. Particularly preferred the mask covers a proportion of the pixels completely, preferably the pixels that have a first converter layer, while the recesses of the mask are arranged above another proportion of the pixels. Preferably, individual pixels or the radiation exit surface of individual pixels are not completely or over the entire surface covered by the mask or not by the mask and the first converter layer.

According to at least one embodiment, the structuring of the second converter layer in step F) is performed by a laser. Preferably, the second converter layer is structured in such a way that it is arranged over a part of the plurality of pixels, while over another part of the plurality of pixels either the first converter layer or no converter layer is arranged.

According to at least one embodiment, the first converter layer and the second converter layer are created on different pixels. After the method has been carried out, either exactly one converter layer, selected from a first converter layer and a second converter layer, is preferred over each pixel, or no converter layer is arranged. Preferably, the first and second converter layers are in direct contact with the radiation exit surfaces of individual pixels and preferably cover these completely or over the entire surface.

According to at least one embodiment, the formed first converter layer and/or the formed second converter layer have a layer thickness between 800 nm inclusive and 1500 nm inclusive. For example, the first and/or second converter layer has a layer thickness of 1 µm. Advantageously, such thin converter layers can be produced by the method according to the embodiments.

According to at least one embodiment, the first converter material and/or the second converter material are quantum dots. Quantum dots are in particular nanoparticles, so particles with a size in the nanometer region with a particle diameter ds, for example, between 3 nm inclusive and to nm inclusive. The quantum dots preferably comprise a semiconductor core or consist of a semiconductor core with wavelength-converting properties. In particular, the core of the quantum dots comprises or consists of an II/IV or III/V semiconductor. For example, the quantum dots are selected from a group comprising InP, CdS, CdSe, InGaAs, GaInP and $CuInSe_2$.

The semiconductor core can be coated with one or more layers as coating. The coating can be organic and/or inorganic, in other words the semiconductor core can be completely or almost completely covered by one or more additional layers on its outer surface or surface. The layer or the layers can comprise or consist of an inorganic material such as zinc sulphide, cadmium sulphide and/or cadmium selenide.

The semiconductor core can be a monocrystalline or polycrystalline agglomerate.

According to at least one embodiment, the quantum dots have an average diameter of 3 nm to 10 nm, especially preferred from 3 nm to 5 nm. By varying the size of the quantum dots, the wavelength of the converting radiation can be specifically varied and thus adapted to the respective application. The quantum dots can be spherical or rod-shaped.

Various further embodiments provide an optoelectronic component. The optoelectronic component is preferably produced by one of the methods specified in connection with one or more of the above embodiments. Features for the method are therefore also disclosed for the component and vice versa.

Yet various other embodiments provide an optoelectronic component. The optoelectronic component comprises a semiconductor layer sequence with a plurality of pixels. The pixels have an edge length between 4500 nm inclusive and 5500 nm inclusive. The semiconductor layer sequence comprises an active layer configured to emit primary radiation in the blue region of the electromagnetic spectrum. Above each pixel there is either exactly one converter layer, selected from a first converter layer and a second converter layer, or no converter layer. The pixels above which no converter layer is arranged are preferably configured to emit the primary radiation. The first converter layer comprises a matrix material and a first converter material. The first converter material is configured to convert the primary radiation into a secondary radiation in the green region of the electromagnetic spectrum. The second converter layer comprises a matrix material and a second converter material. The second converter material is configured to convert the primary radiation into a secondary radiation in the red region of the electromagnetic spectrum.

BRIEF DESCRIPTION OF THE DRAWINGS

Further advantages, advantageous embodiments and developments result from the exemplary embodiments described in the following in connection with the figures. Identical and similar or identically acting elements are provided with the same reference numbers. The figures and the proportions of the elements shown in the figures are not to be regarded as true to scale. Rather, individual elements can be oversized or simplified for better representability and/or better understanding.

DETAILED DESCRIPTION OF ILLUSTRATIVE EMBODIMENTS

Figure 1:
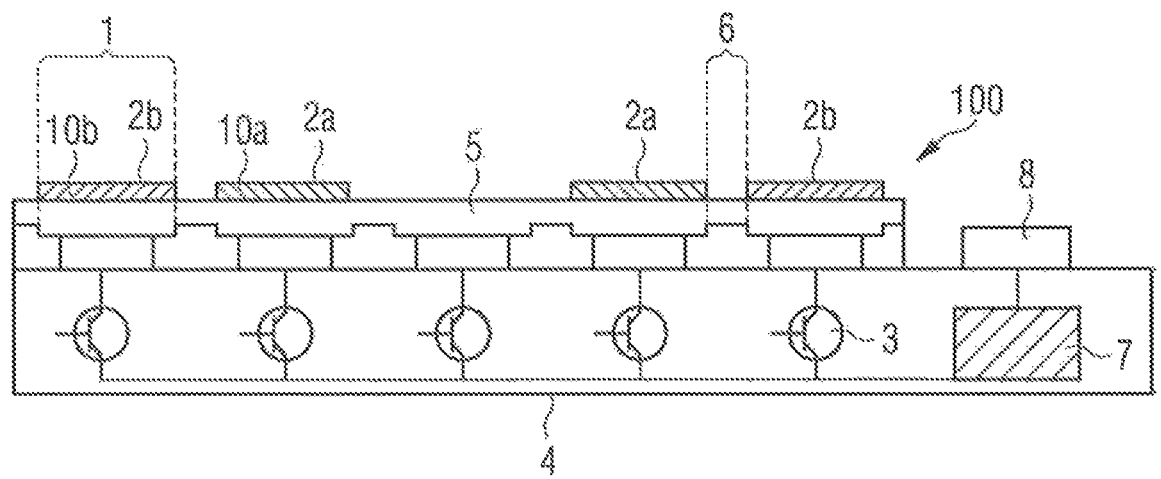
FIG. 1 shows a schematic side view of an optoelectronic component.

FIG. 1 shows a schematic side view of an optoelectronic component 100. The optoelectronic component 100 has a carrier 4. In the carrier 4 is a plurality of control units 3. The carrier 4 is preferably based on silicon and the control units 3 are produced in CMOS technology in the carrier 4. A semiconductor layer sequence 5 is arranged above the carrier 4. The semiconductor layer sequence 5 is based on gallium nitride and comprises an active layer (not shown) for generating a primary radiation in the blue region of the electromagnetic spectrum with a peak wavelength of 460 nm, for example. The semiconductor layer sequence 5 is divided into a plurality of pixels 1. Each of the pixels 1 is preferably assigned exactly one of the control units 3 and vice versa. An optional separation region 6 is located between adjacent pixels 1. The separation regions 6 can be used to achieve electrical and/or optical isolation of the individual pixels 1 from each other. The semiconductor layer sequence 5 is only partially broken in the separation regions 6, for example, by unfilled or filled trenches, and extends as a continuous layer parallel to and over the entire carrier 4. Above each pixel 1 there is either exactly one first converter layer 2a or a second converter layer 2b or no converter layer. The first converter layer 2a comprises a matrix material and a first converter material 10a which is configured to convert the primary radiation into a secondary radiation in the green region of the electromagnetic spectrum. The second converter layer 2b comprises a matrix material and a second converter material (10b) which is configured to convert the primary radiation into a secondary radiation in the red region of the electromagnetic spectrum. The pixel 1, above which no converter layer is arranged, are configured to emit the primary radiation in the blue region of the electromagnetic spectrum. The contacting can be established via a microcontroller 7 and a connection 8.

Figure 2A:
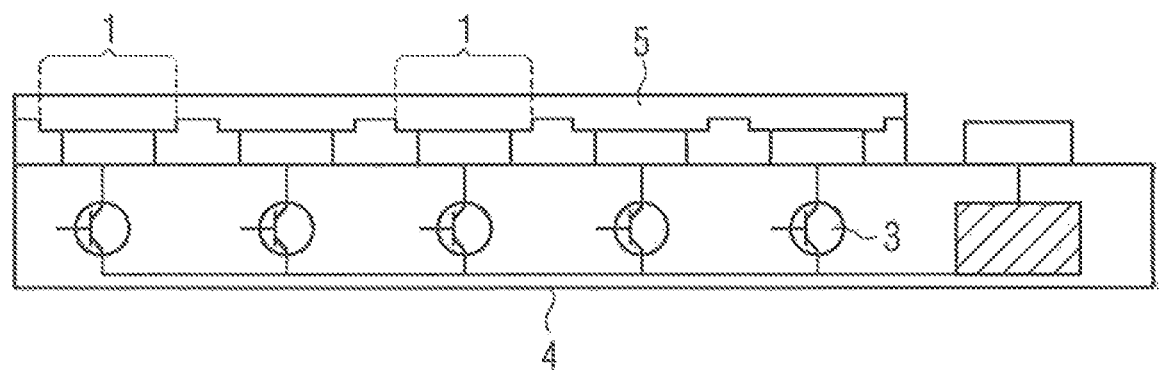
FIGS. 2A to 2H schematically show a method for producing an optoelectronic component.
Figure 2B:
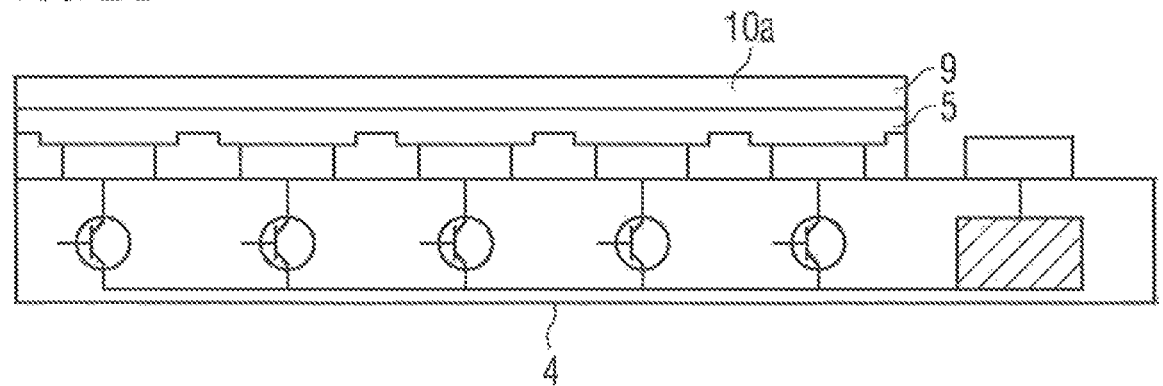
Figure 2C:
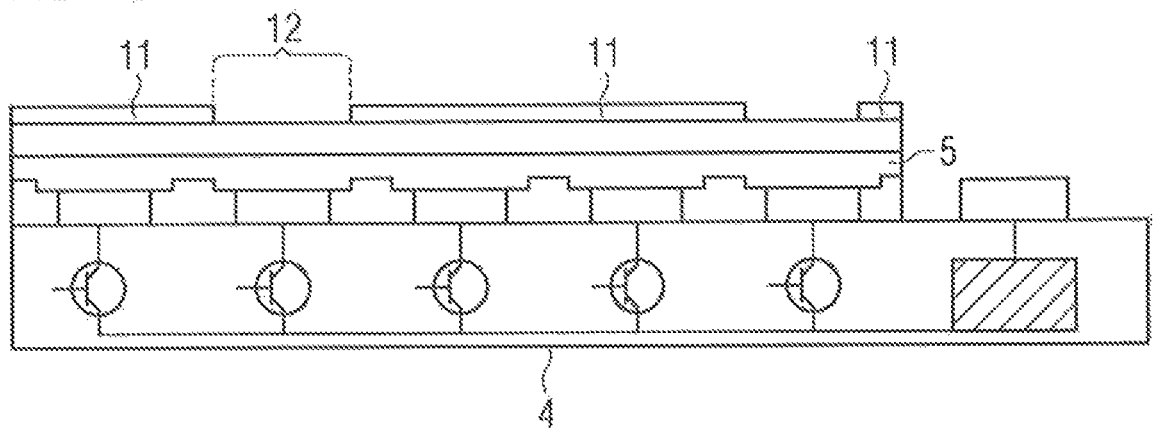

FIGS. 2A to 2H schematically show a method for producing an optoelectronic component 100 of FIG. 1. As shown in FIG. 2A, a semiconductor layer sequence 5 comprising a plurality of pixels 1 is provided on a carrier 4. A photoresist 9 and a first converter material 10a are applied to the semiconductor layer sequence 5 (FIG. 2B). For example, the photoresist 9 comprises a platinum catalyst, a compound of formula 1 and a compound of formula 2

Formula 1

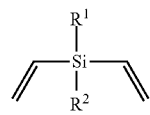

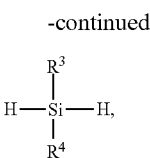

Formula 2 where $R^1=R^2=R^3=R^4=CH_3$.

Figure 2D:
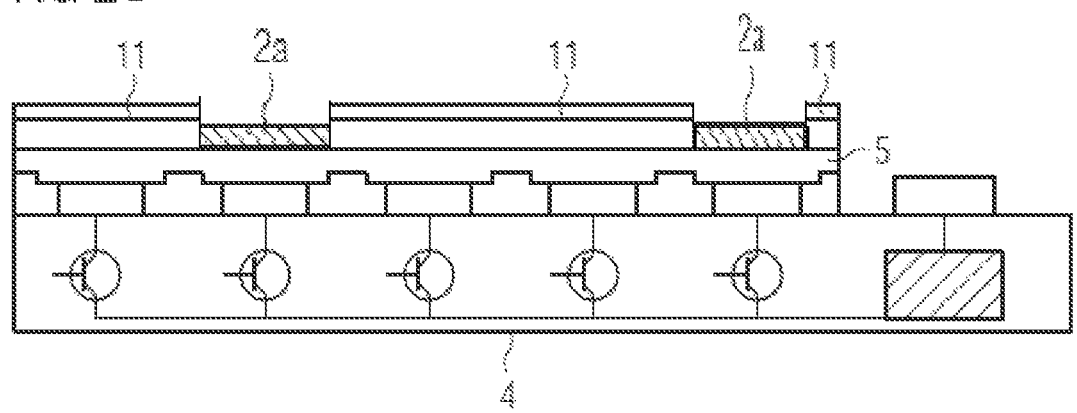
Figure 2E:
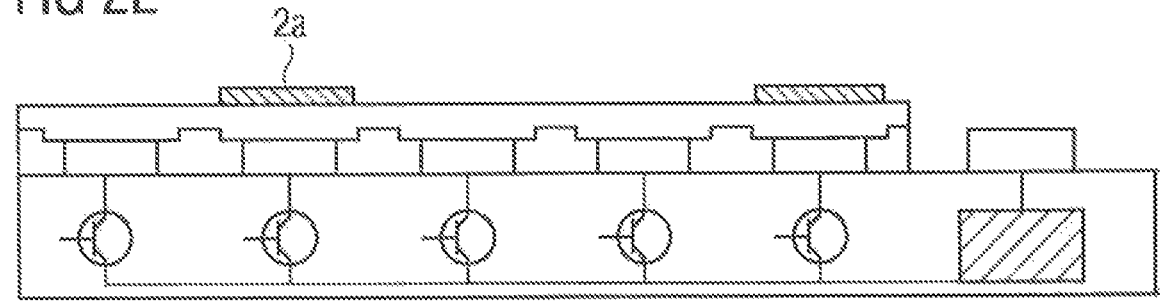
Figure 2F:
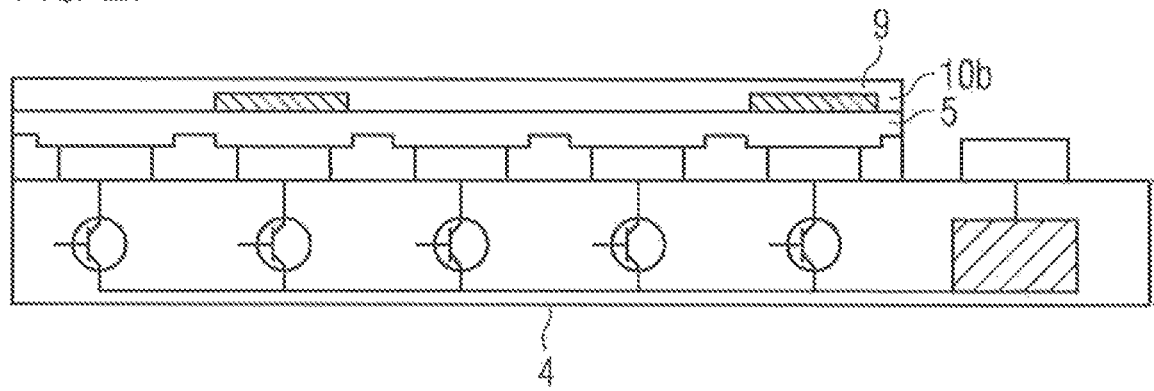
Figure 2G:
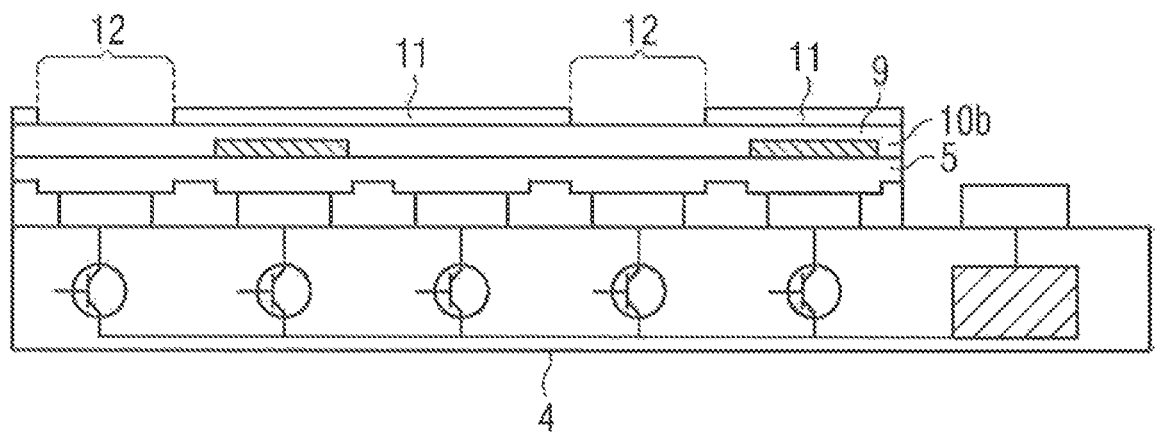
Figure 2H:
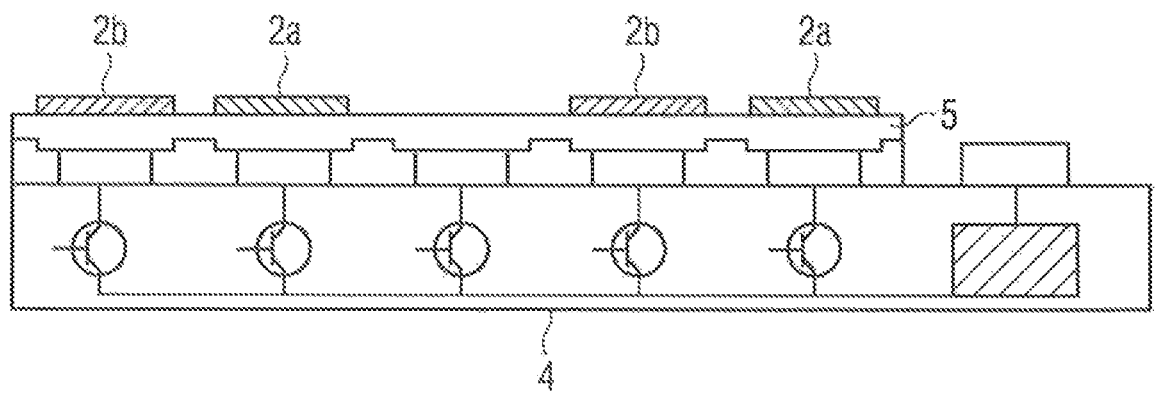

A mask 11 with recesses 12 is applied to the photoresist 9. Individual pixels 1 or the radiation exit surface of individual pixels are not completely or over the entire surface covered by the mask 11, while the mask completely covers other pixels 1. Subsequently, the photoresist 9 is exposed to radiation with a peak wavelength of, for example, 1000 nm in the areas of the recesses 12 of mask 11. The radiation activates the catalyst and catalysis the hydrosilylation and thus the cross-linking of the compounds of formulae 1 and 2. The photoresist 9 hardens and the first converter layer 2a is formed in the areas of the recesses 12 of the mask 11 (FIG. 2D). The photoresist 9 is then removed from the unexposed areas, thus removing the uncured photoresist 9 (FIG. 2E). In a next step, a photoresist 9 and a second converter material 10b are applied to the semiconductor layer sequence 5 (FIG. 2F). A mask 11 with recesses 12 is applied to the photoresist 9 (FIG. 2G). In the method, individual pixels 1 or the radiation exit surface of individual pixels are not completely or over the entire surface covered by the mask 11, while the mask 11 completely covers other pixels 1, including those that already have a first converter layer 2a. Subsequently, the photoresist 9 is exposed to radiation with a peak wavelength of, for example, 1000 nm in the areas of the recesses 12 of the mask 11. The exposure hardens the photoresist 9 and the second converter layer 2b is formed. The uncured photoresist 9 is then removed from the unexposed areas and the optoelectronic component of FIG. 2H or FIG. 1 is obtained.

The invention described here is not limited by the description with reference to the exemplary embodiments. Rather, the invention includes each new feature as well as each combination of features, which in particular includes each combination of features in the patent claims, even if that feature or combination itself is not explicitly mentioned in the patent claims and exemplary embodiments.

The invention claimed is:

1. A method for producing an optoelectronic component, the method comprising:
   providing a semiconductor layer sequence comprising a plurality of pixels, wherein the plurality of pixels have a common active layer that extends laterally through all pixels along a major surface of the semiconductor layer sequence, and wherein the active layer is configured to emit primary radiation in a blue region of an electromagnetic spectrum with a first peak wavelength of between 420 nm inclusive and 480 nm inclusive;
   applying a first photoresist and a first converter material on the semiconductor layer sequence;
   exposing the first photoresist with radiation having a second peak wavelength longer than the first peak wavelength of the primary radiation;
   curing the first photoresist by polymerization in order to form a first converter layer comprising a first matrix material and the first converter material; and
   structuring the first converter layer,
   wherein the first photoresist comprises a catalyst, a monomer having at least two SiH groups and a monomer having at least two terminal double bonds, and
   wherein the polymerization is a hydrosilylation.

2. The method according to claim 1, wherein exposing the first photoresist comprises exposing the first photoresist with the radiation having the second peak wavelength between 480 nm and 10000 nm inclusive.

3. The method according to claim 1, wherein the first photoresist comprises at least the monomers and the catalyst.

4. The method according to claim 1, wherein the first photoresist comprises at least the monomers and an inhibitor.

5. The method according to claim 1, further comprising:
   applying a mask over the first photoresist, wherein the mask has recesses,
   wherein exposing the first photoresist takes place in regions of the recesses of the mask, and
   wherein structuring the first converter layer comprises removing the first photoresist at unexposed regions.

6. The method according to claim 1, wherein structuring the first converter layer is performed by a laser.

7. The method according to claim 1, wherein the first converter material comprises quantum dots.

8. The method according to claim 1, wherein forming the first converter layer comprises forming the first converter layer with a layer thickness between 800 nm inclusive and 1500 nm inclusive.

9. The method according to claim 1, further comprising:
   applying a second photoresist and a second converter material on the semiconductor layer sequence;
   exposing the second photoresist with a second radiation having a third peak wavelength longer than the first peak wavelength of the primary radiation;
   curing the second photoresist by polymerization in order to form a second converter layer comprising a second matrix material and the second converter material; and
   structuring the second converter layer.

10. A method for producing an optoelectronic component, the method comprising:
    providing a semiconductor layer sequence comprising a plurality of pixels and an active layer, wherein the active layer is configured to emit primary radiation in a blue region of an electromagnetic spectrum with a first peak wavelength of between 420 nm inclusive and 480 nm inclusive;
    applying a first photoresist and a first converter material on the semiconductor layer sequence, wherein the first photoresist comprises a catalyst, a monomer having at least two SiH groups and a monomer having at least two terminal double bonds;
    exposing the first photoresist with radiation having a second peak wavelength longer than the first peak wavelength of the primary radiation;
    curing the first photoresist by polymerization in order to form a first converter layer comprising a matrix material and the first converter material, wherein the polymerization is a hydrosilylation; and
    structuring the first converter layer.

11. The method according to claim 10, wherein the first photoresist comprises at least the monomers and the catalyst.

12. The method according to claim 10, wherein the first photoresist comprises at least the monomers and an inhibitor.

13. The method according to claim 10, wherein structuring the first converter layer is performed by a laser.

14. The method according to claim 10, further comprising:
- applying a second photoresist and a second converter material on the semiconductor layer sequence;
- exposing the second photoresist with a second radiation having a third peak wavelength longer than the first peak wavelength of the primary radiation;
- curing the second photoresist by polymerization in order to form a second converter layer comprising a first matrix material and the second converter material; and
- structuring the second converter layer.

15. The method according to claim 10, wherein the first converter material comprises quantum dots.

16. The method according to claim 10, wherein exposing the first photoresist comprises exposing the first photoresist with the radiation having the second peak wavelength between 480 nm and 10000 nm inclusive.

17. The method according to claim 10, further comprising:
- applying a mask over the first photoresist, wherein the mask has recesses,
- wherein exposing the first photoresist takes place in regions of the recesses of the mask, and
- wherein structuring the first converter layer comprises removing the first photoresist at unexposed regions.

18. The method according to claim 10, wherein forming the first converter layer comprises forming the first converter layer with a layer thickness between 800 nm inclusive and 1500 nm inclusive.

* * * * *